United States Patent
Kwon et al.

(10) Patent No.: US 9,368,084 B2
(45) Date of Patent: Jun. 14, 2016

(54) DISPLAY APPARATUS AND METHOD THEREOF

(75) Inventors: Ji-Hyun Kwon, Asan-si (KR); Ho-Kyoon Kwon, Seoul (KR); Dong-Hyon Ki, Seoul (KR); Won-Hee Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 1412 days.

(21) Appl. No.: 12/351,095

(22) Filed: Jan. 9, 2009

(65) Prior Publication Data

US 2010/0013823 A1   Jan. 21, 2010

(30) Foreign Application Priority Data

Jul. 21, 2008   (KR) .................. 10-2008-0070730

(51) Int. Cl.
*G09G 3/36*   (2006.01)
*G11C 19/18*   (2006.01)

(52) U.S. Cl.
CPC ............. *G09G 3/3674* (2013.01); *G11C 19/184* (2013.01); *G09G 2310/0286* (2013.01); *G09G 2320/043* (2013.01)

(58) Field of Classification Search
CPC .......... G09G 3/3674; G09G 2320/043; G09G 2310/0286; G11C 19/184
See application file for complete search history.

(56) References Cited

U.S. PATENT DOCUMENTS

| | | | |
|---|---|---|---|
| 2005/0008114 A1* | 1/2005 | Moon | 377/64 |
| 2006/0066800 A1* | 3/2006 | Furukoshi | 349/151 |
| 2007/0052656 A1* | 3/2007 | Park et al. | 345/100 |

FOREIGN PATENT DOCUMENTS

| | | |
|---|---|---|
| JP | H1184427 A | 3/1999 |
| JP | 2006235437 A | 9/2006 |
| KR | 20030080979 A | 10/2003 |

* cited by examiner

*Primary Examiner* — Sahlu Okebato
(74) *Attorney, Agent, or Firm* — Cantor Colburn LLP

(57) ABSTRACT

In the display apparatus, a gate driver receives at least one clock to sequentially provide gate lines in a display panel with a gate signal in a high state corresponding to a high interval of the clock. The gate driver includes a plurality of amorphous silicon transistors and is formed in the display panel through a thin film process. The clock has a delay time of about 2.0 μs or less. If the delay time of the clock is reduced less than about 2.0 μs, a threshold voltage margin of the transistors increases, so that the gate driver may not malfunction in a high temperature aging process. As a result, the gate driver may be prevented from malfunctioning in the high temperature aging process.

14 Claims, 6 Drawing Sheets

DISPLAY APPARATUS AND METHOD THEREOF

This application claims priority to Korean Patent Application No. 2008-70730, filed on Jul. 21, 2008, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and a method thereof. More particularly, the present invention relates to a display apparatus capable of preventing a gate driver from malfunctioning due to high temperature aging, and a method of preventing a gate driver from malfunctioning.

2. Description of the Related Art

In general, a liquid crystal display ("LCD") includes an LCD panel that displays an image. The LCD panel includes a bottom substrate, a top substrate facing the bottom substrate, and a liquid crystal layer interposed between the bottom and top substrates.

The LCD panel includes a plurality of gate lines, a plurality of data lines, and a plurality of pixels connected with the gate and data lines. A gate driver is directly formed in the LCD panel through a thin film process to sequentially output a gate signal to the gate lines.

In general, the gate driver includes one shift register having a plurality of stages connected with each other one after another. In detail, each stage includes a plurality of transistors in order to output the gate signal to a corresponding gate line. Each transistor includes an amorphous silicon ("a-Si") transistor.

BRIEF SUMMARY OF THE INVENTION

It has been determined herein that if a gate driver is installed in an LCD panel and is subject to a high temperature aging process, then a threshold voltage of a transistor in the gate driver increases due to the temperature, thereby causing malfunction of the gate driver.

Therefore, exemplary embodiments of the present invention provide a display apparatus capable of preventing a gate driver from malfunctioning due to high temperature aging.

In an exemplary embodiment of the present invention, a display apparatus includes a display panel, a data driver and a gate driver. The display panel has gate lines, data lines and a plurality of pixels. The gate lines sequentially receive a gate signal. The data lines receive a data signal. The pixels display an image corresponding to the data signal in response to the gate signal. The data driver provides the data signal to the data lines. The gate driver is provided in the display panel and receives at least one clock to sequentially provide the gate lines with the gate signal in a high state corresponding to a high interval of the clock. The clock has delay time of about 2.0 μs or less.

According to the above, the gate driver includes amorphous silicon ("a-Si") transistors and is formed on the display panel through a thin film process. In addition, the gate driver receives a clock having a delay time of about 2.0 μs or less to sequentially output the gate signal.

In another exemplary embodiment of the present invention, a method of preventing a gate driver in a display apparatus from malfunctioning due to a high temperature aging process, where the display apparatus includes a display panel having gate lines to sequentially receive a gate signal, data lines to receive a data signal from a data driver, and a plurality of pixels to display an image corresponding to the data signal in response to the gate signal, includes forming a gate driver in the display panel to receive at least one clock to sequentially provide the gate lines with the gate signal in a high state corresponding to a high interval of the clock, and delivering the clock within the gate driver with a delay time of about 2.0 μs or less.

Thus, a threshold voltage margin of the transistors increases, so that the gate driver may not malfunction in a high temperature aging process. As a result, the gate driver may be prevented from malfunctioning in the high temperature aging process.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
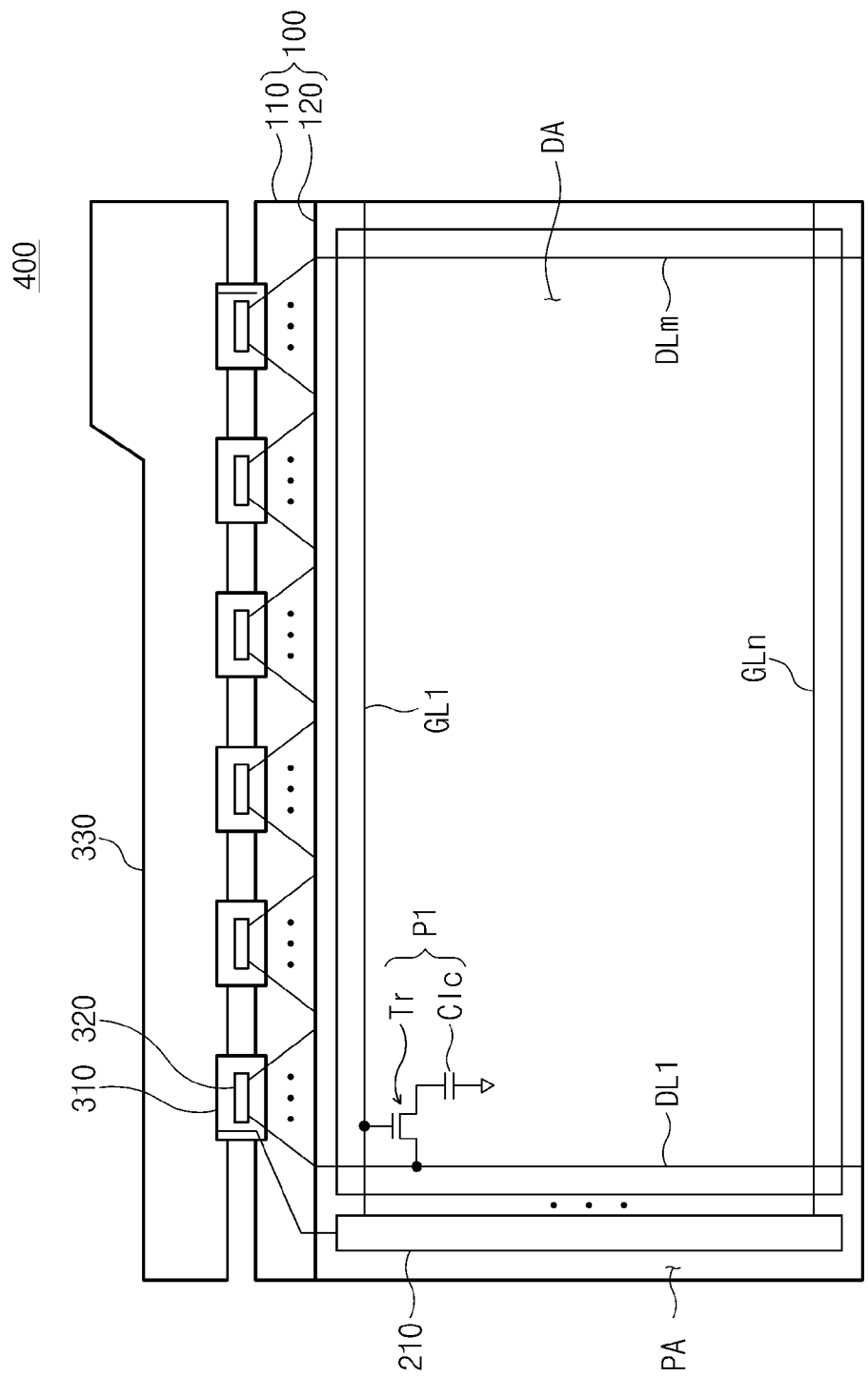
FIG. 1 is a plan view illustrating an exemplary embodiment of a liquid crystal display ("LCD") according to the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

FIG. 1 is a plan view illustrating an exemplary embodiment of a liquid crystal display ("LCD") according to the present invention.

Referring to FIG. 1, an LCD 400 includes an LCD panel 100 displaying an image, a plurality of data driving chips 320 outputting a data voltage to the LCD panel 100, and a gate driver 210 outputting a gate signal to the LCD panel 100.

The LCD panel 100 includes a bottom substrate 110, a top substrate 120 facing the bottom substrate, and a liquid crystal layer (not shown) interposed between the bottom and top substrates 110 and 120. The LCD panel 100 includes a display area DA displaying an image, and a peripheral area PA adjacent to the display area DA.

The display area DA includes a plurality of pixel areas arranged in a matrix configuration, and a plurality of gate lines GL1 to GLn and a plurality of data lines DL1 to DLm insulated from the gate lines GL1 to GLn while crossing the gate lines GL1 to GLn. Each pixel area includes a pixel P1 having a thin film transistor ("TFT") Tr and a liquid crystal capacitor Clc. For example, the TFT Tr includes a gate electrode electrically connected with the first gate line GL1, a source electrode electrically connected with the first data line DL1, and a drain electrode electrically connected with a pixel electrode serving as a first electrode of the liquid crystal capacitor Clc.

The gate driver 210 is provided in the peripheral area PA while being adjacent to one end portion of each of the gate lines GL1 to GLn. The gate driver 210 is electrically connected with one end portion of each of the gate lines GL1 to GLn to sequentially apply the gate signal to the gate lines GL1 to GLn.

A plurality of tape carrier packages ("TCPs") 310 are attached to the peripheral area PA while being adjacent to one end portion of each of the data lines DL1 to DLm. The data driving chips 320 are mounted on the TCPs 310, respectively. The data driving chips 320 are electrically connected with one end portion of each of the data lines DL1 to DLm to output the data voltage to the data lines DL1 to DLm.

The LCD 400 further includes a printed circuit board ("PCB") 330 that controls driving of the gate driver 210 and the data driving chips 320. The PCB 330 outputs a data control signal that controls the driving of the data driving chips 320, and image data as well as a gate control signal that controls the driving of the gate driver 210. The data driving chips 320 receive the image data in synchronization with the data control signal, and converts the image data into the data voltage to output the data voltage to the data lines DL1 to DLm. The gate driver 210 receives the gate control signal through the TCP 310 to sequentially output the gate signal to the gate lines GL1 to GLn in response to the gate control signal.

The liquid crystal capacitor Clc is charged with the data voltage in response to the gate signal to control transmittance of the liquid crystal layer, thereby displaying a desired image.

In the present exemplary embodiment, the gate driver 210 is formed substantially simultaneously with the pixels P1 through a thin film process of forming the pixels P1 on the bottom substrate 110. The gate driver 210 is integrated on the bottom substrate 110, so that driving chips having the gate driver 210 are not needed on the LCD 400. Thus, the productivity of the LCD 400 can be improved and the size of the LCD 400 can be reduced.

Figure 2:
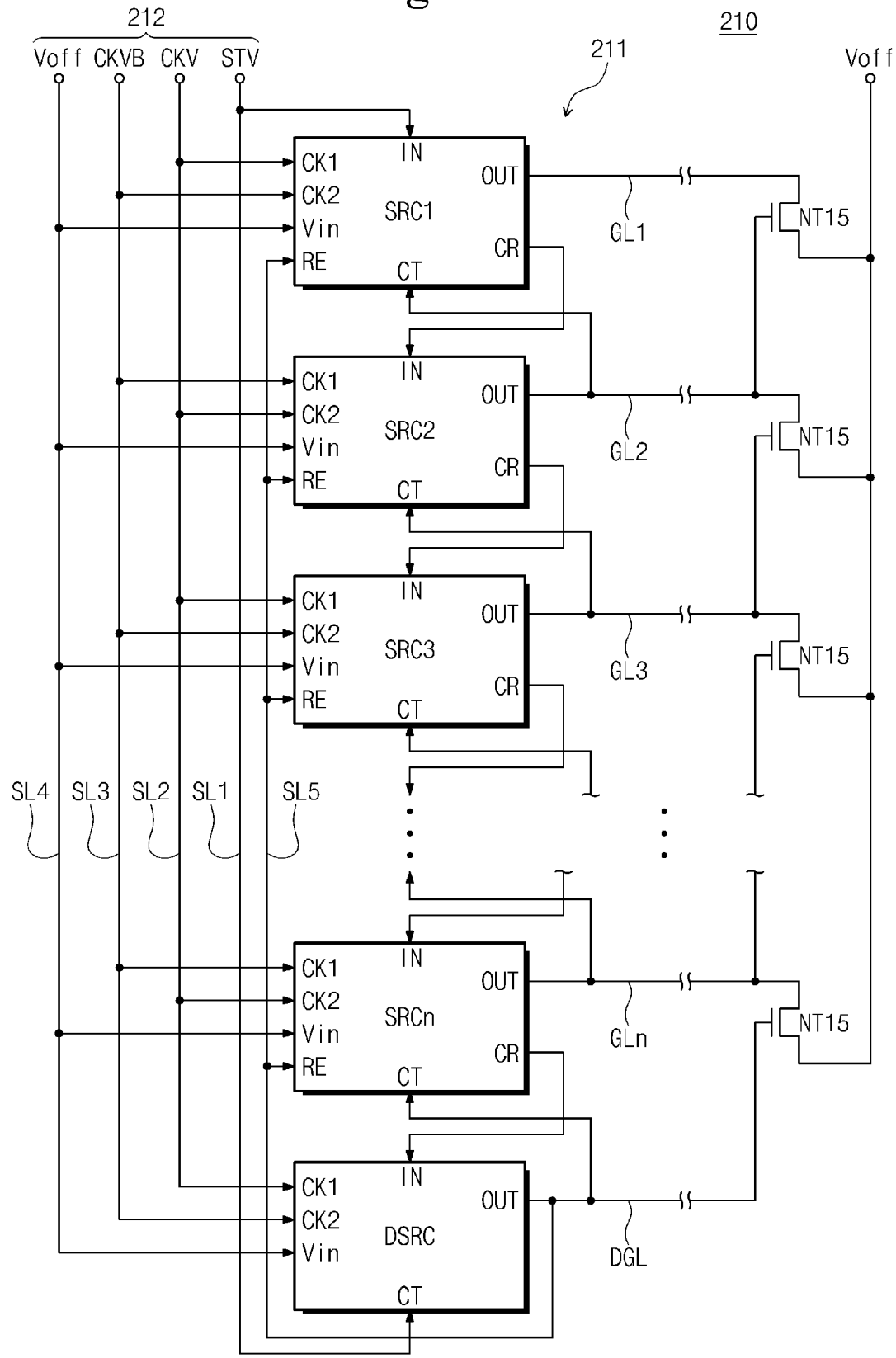
FIG. 2 is a block diagram of the exemplary gate driver shown in FIG. 1.

FIG. 2 is a block diagram of the exemplary gate driver shown in FIG. 1.

Referring to FIG. 2, the gate driver 210 includes one shift register 211 having a plurality of driving stages SRC1 to SRCn connected with each other one after another and a dummy stage DSRC. The shift register 211 is provided to a first end of each of the gate lines GL1 to GLn.

Each of the driving stages SRC1 to SRCn includes an input terminal IN, first and second clock terminals CK1 and CK2, a control terminal CT, a voltage input terminal Vin, a reset terminal RE, an output terminal OUT and a carry terminal CR.

The input terminal IN of each driving stage is electrically connected with the carry terminal CR of a previous stage to receive the previous carry signal from the previous stage. However, the input terminal IN of the first driving stage SRC1 receives a vertical start signal STV representing start of driving of the gate driver 210 instead of the previous carry signal. The control terminal CT of each driving stage is electrically connected with the output terminal OUT of the next stage to receive the next gate signal from the next stage. However, the control terminal CT of the last stage SRCn is electrically connected with an output terminal OUT of the dummy stage DSRC. In the present exemplary embodiment, the control terminal CT of the dummy stage DSRC receives the vertical start signal STV instead of the next gate signal.

A first clock CKV is applied to the first clock terminals CK1 of odd-numbered driving stages SRC1, SRC3, . . . , SRC(n−1) among the driving stages SRC1 to SRCn, and a second clock CKVB having an opposite phase to that of the first clock CKV is applied to the second clock terminals CK2 of the odd-numbered driving stages SRC1, SRC3, . . . , SRC (n−1). The second clock CKVB is applied to the first clock terminals CK1 of the even-numbered stages SRC2, . . . , SRCn among the driving stages SRC1 to SRCn, and the first clock CKV is applied to the second clock terminals CK2 of the even-numbered stages SRC2, . . . , SRCn. Assuming that n is an even number, the first clock CKV is provided to a first clock terminal CK1 of the dummy stage DSRC and the second clock CKVB is provided to a second clock terminal CK2 of the dummy stage DSRC. In the present exemplary embodiment, each of the first and second clocks CKV and CKVB have a delay time of about 2.0 µs or less.

A gate off voltage $V_{off}$ is applied to the voltage input terminals Vin of the driving stages SRC1 to SRCn and the dummy stage DSRC. The gate off voltage $V_{off}$ may be a ground voltage or a minus voltage.

The gate lines GL1 to GLn are electrically connected with the output terminals OUT of the driving stages SRC1 to SRCn, respectively. Thus, the driving stages SRC1 to SRCn sequentially apply the gate signal to the gate lines GL1 to GLn through the output terminals OUT thereof.

The carry terminal CR of each driving stage is electrically connected with the input terminal IN of the next stage to provide a carry signal to the next stage. The carry terminal CR of the last driving stage SRCn is electrically connected with the input terminal IN of the dummy stage DSRC.

The output terminal OUT of the dummy stage DSRC is electrically connected with the reset terminals RE of the driving stages SRC1 to SRCn and the control terminal CT of the last driving stage SRCn. Thus, a signal output from the output terminal OUT of the dummy stage DSRC is applied to the reset terminals RE of the driving stages SRC1 to SRCn to reset the driving stages SRC1 to SRCn. In addition, the signal output from the output terminal OUT of the dummy stage DSRC is applied to the control terminal CT of the last driving stage SRCn, so that the gate signal output from the last driving stage SRCn is down.

Each of the driving stages SRC1 to SRCn includes a discharge transistor NT15 provided to a second end of a corresponding gate line of the gate lines GL1 to GLn. The discharge transistor NT15 includes a control electrode connected with the next gate line, an input electrode receiving the gate off voltage $V_{off}$, and an output electrode connected with the present gate line. Thus, the present gate line is discharged to the gate off voltage $V_{off}$ by the discharge transistor NT15 when the next gate signal is supplied to the discharge transistor NT15 from the next stage.

The control electrode of the discharge transistor NT15, by which the last gate line GLn is discharged, is electrically connected with the output terminal OUT of the dummy stage DSRC through a dummy gate line DGL. Thus, the last gate line GLn is discharged to the gate off voltage $V_{off}$ by the last discharge transistor NT15 when a signal is supplied to the last discharge transistor NT15 from the output terminal OUT of the dummy stage DSRC.

The gate driver 210 further includes an interconnection unit 212 adjacent to the shift register 211. In an exemplary embodiment, the driving stages SRC1 to SRCn and dummy stage DSRC are positioned between the interconnection unit 212 and the gate lines GL1 to GLn. The interconnection unit 212 includes a start signal interconnection SL1, a second clock interconnection SL2, a third clock interconnection SL3, a voltage interconnection SL4 and a reset interconnection SL5.

The start signal interconnection SL1 is electrically connected with the input terminal IN of the first driving stage SRC1 and the control terminal CT of the dummy stage DSRC to supply the vertical start signal STV. Assuming that n is an even number, the second clock interconnection SL2 is electrically connected with the first clock terminals CK1 of the odd-numbered driving stages SRC1, SRC3, . . . , SRC(n−1) and the dummy stage DSRC as well as the second clock terminals CK2 of the even-numbered driving stages SRC2, . . . , SRCn, thereby supplying the first clock CKV. The third clock interconnection SL3 is electrically connected with the first clock terminals CK1 of the even-numbered driving stages SRC2, . . . , SRCn as well as the second clock terminals CK2 of the odd-numbered driving stages SRC1, SRC3, . . . , SRC(n−1) and the dummy stage DSRC, thereby supplying the second clock CKVB.

The voltage interconnection SL4 is electrically connected with the voltage input terminals Vin of the driving stages SRC1 to SRCn and the dummy stage DSRC to supply the gate off voltage $V_{off}$. The reset interconnection SL5 electrically connects the output terminal OUT of the dummy stage DSRC with the reset terminals RE of the driving stages SRC1 to SRCn, thereby supplying the signal output from the dummy stage DSRC to the reset terminals RE of the driving stages SRC1 to SRCn.

The second and third clock interconnections SL2 and SL3 are designed such that each of the first and second clocks CKV and CKVB has the delay time of about 2.0 µs or less. In detail, the delay time of the first and second clocks CKV and CKVB is determined by a capacitor and a resistor connected with the second and third clock interconnections SL2 and SL3, and the resistor varies depending on the widths and thicknesses of the second and third clock interconnections SL2 and SL3. According to the present invention, the delay time of the first and second clocks CKV and CKVB may be reduced to be less than about 2.0 µs by increasing the widths and thicknesses of the second and third clock interconnections SL2 and SL3.

Figure 3A:
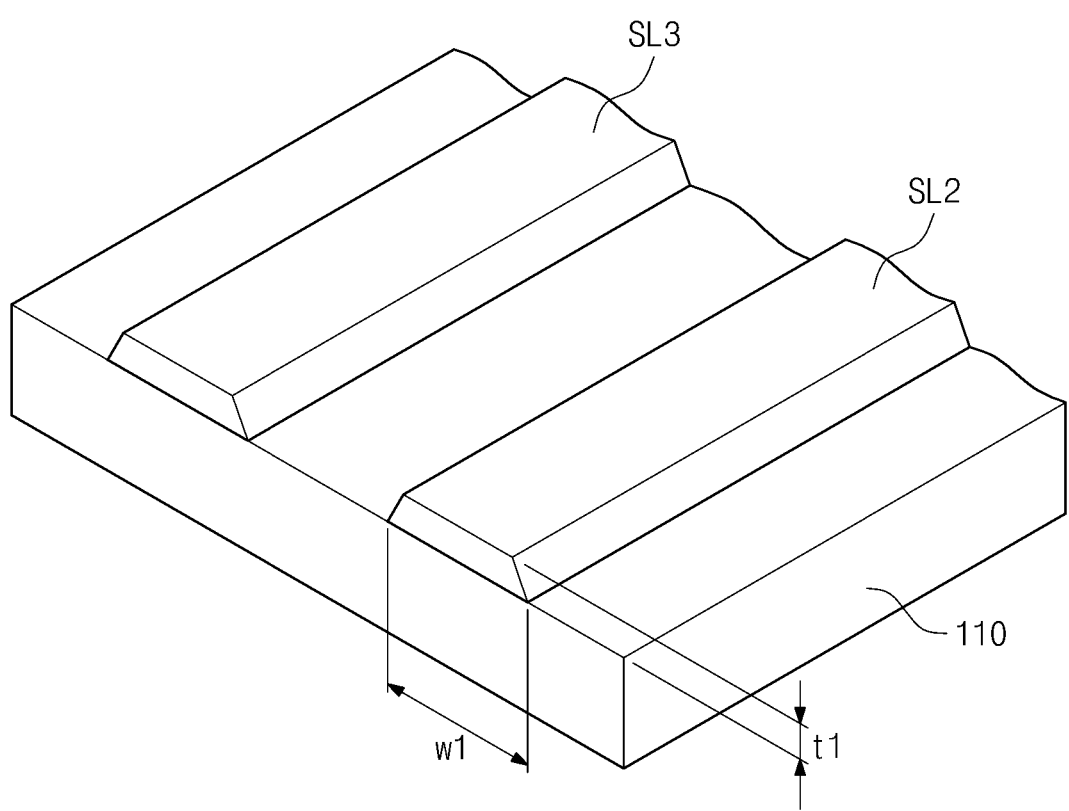
FIG. 3A is a cut perspective view illustrating an exemplary embodiment of first and second clock interconnections according to the present invention.
Figure 3B:
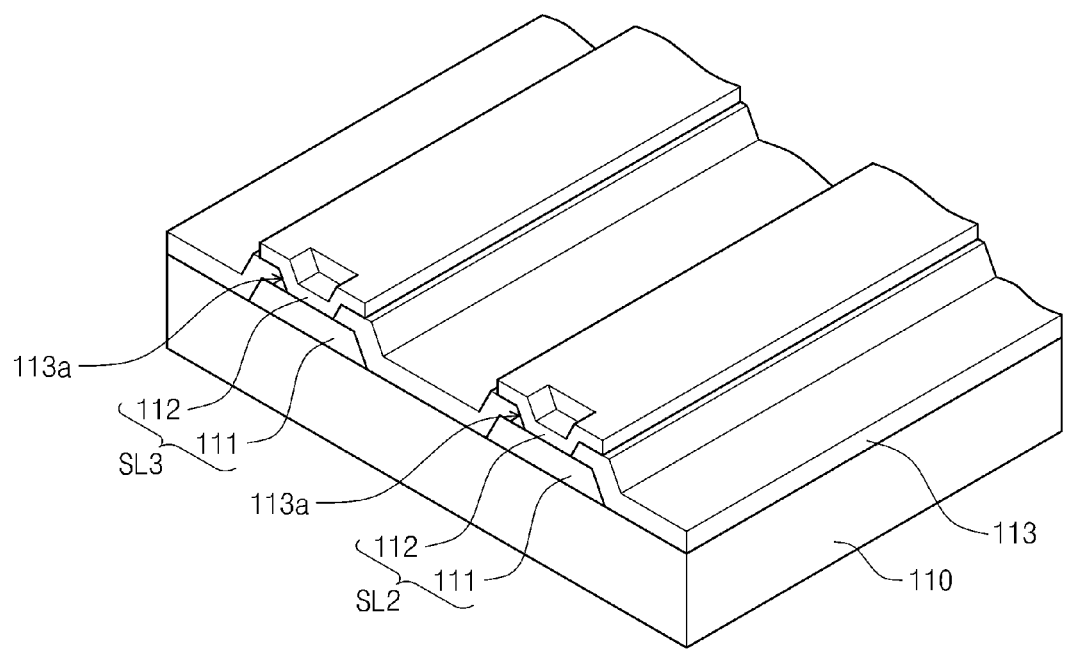
FIG. 3B is a cut perspective view illustrating another exemplary embodiment of first and second clock interconnections according to the present invention.

FIGS. 3A and 3B illustrate a structure in which the thicknesses of the second and third clock interconnections are increased to reduce the delay time of the first and second clocks.

FIG. 3A is a cut perspective view illustrating an exemplary embodiment of the second and third clock interconnections according to the present invention.

Referring to FIG. 3A, the second and third clock interconnections SL2 and SL3 have a single layer structure including a first metal layer while being formed on the bottom substrate 110. The first metal layer is used when the gate lines GL1 to GLn and the gate electrode of the TFT Tr are formed on the bottom substrate 110. Thus, the second and third clock interconnections SL2 and SL3 are substantially simultaneously formed through a process of forming the gate lines GL1 to GLn and the gate electrode of the TFT Tr on the bottom substrate 110.

As the thicknesses t1 of the second and third clock interconnections SL2 and SL3 are increased, the delay time of the first and second clocks CKV and CKVB (see FIG. 2) is reduced. Thus, the thicknesses t1 of the second and third clock interconnections SL2 and SL3 are increased such that the delay time of the first and second clocks CKV and CKVB is reduced to be less than about 2.0 μs. In the present exemplary embodiment, each of the second and third clock interconnections SL2 and SL3 may have a thickness of about 1500 Å to about 3000 Å.

In order to allow the first and second clocks CKV and CKVB to have the delay time of about 2.0 μs or less, the widths w1 of the second and third clock interconnections SL2 and SL3 may also be increased.

FIG. 3B is a cut perspective view illustrating another exemplary embodiment of the second and third clock interconnections according to the present invention.

Referring to FIG. 3B, the second and third clock interconnections SL2 and SL3 have a multi-layer structure. In an exemplary embodiment, each of the second and third clock interconnections SL2 and SL3 has a structure, in which at least one layer is laminated. Each of the second and third interconnections SL2 and SL3 includes a first interconnection 111 and a second interconnection 112 formed on the first interconnection 111. The first interconnection 111 may be substantially simultaneously formed through a process of forming the gate lines GL1 to GLn and the gate electrode of the TFT Tr on the bottom substrate 110. The second interconnection 112 may be substantially simultaneously formed through a process of forming the data lines DL1 to DLm and the source/drain electrodes of the TFT Tr on the bottom substrate 110.

An insulating layer 113 is interposed between the first and second interconnections 111 and 112. The insulating layer 113 is formed with one or more contact holes 113a formed therethrough to expose the first interconnection 111. Thus, the second interconnection 112 is electrically connected with the first interconnection 111 through the contact holes 113a.

As described above, each of the second and third clock interconnections SL2 and SL3 has the multi-layer structure, so that a resistance value of the second and third clock interconnections SL2 and SL3 is reduced. Thus, the delay time of the first and second clocks CKV and CKVB may be reduced so as to be less than about 2.0 μs.

Figure 4:
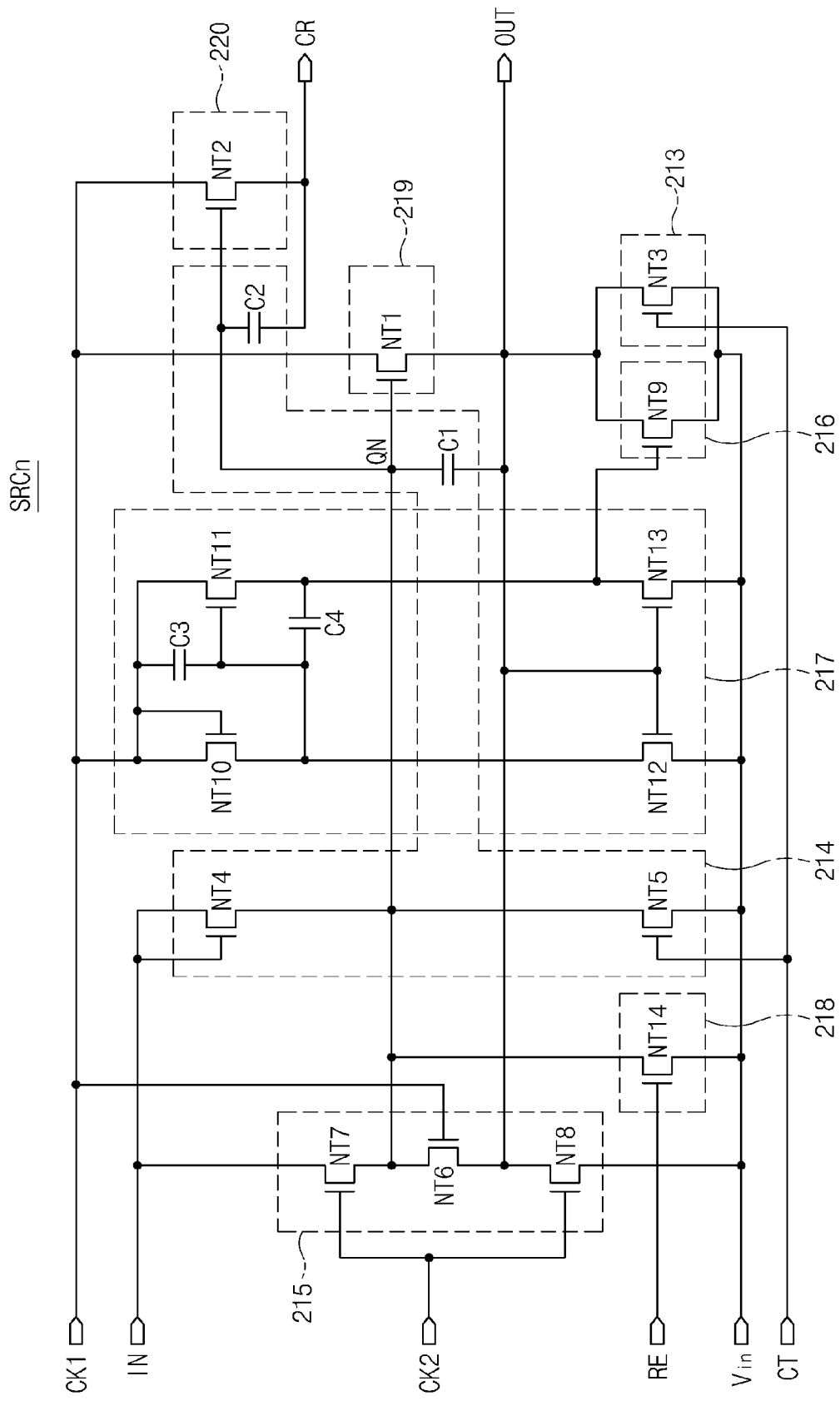
FIG. 4 is a circuit diagram of the exemplary last driving stage shown in FIG. 2.

FIG. 4 is a circuit diagram of the exemplary last driving stage shown in FIG. 2. Since the driving stages provided in the gate driver have the same internal circuit configuration, the last driving stage will be representatively described with reference to FIG. 4.

Referring to FIG. 4, the last driving stage SRCn includes a pull-up unit 219, a carry unit 220, a pull-down unit 213, a pull-up driver 214, a ripple preventing unit 215, a holding unit 216, an inverter unit 217 and a reset unit 218.

The pull-up unit 219 includes a pull-up transistor NT1 having a control electrode connected with an output terminal (hereinafter, referred to as a Q-node QN) of the pull-up driver 214, an input electrode connected with the first clock terminal CK1, and an output electrode connected with the output terminal OUT. The pull-up transistor NT1 pulls up the present gate signal output through the output terminal OUT to a high level of a clock (hereinafter, referred to as the first clock CKV as shown in FIG. 2) provided through the first clock terminal CK1 in response to a voltage output from the pull-down unit 213. The pull-up transistor NT1 is turned on during a high interval (hereinafter, referred to as a first interval) of the first clock CK1 of one frame, thereby maintaining the present gate signal in a high state during the first interval.

The carry unit 220 includes a carry transistor NT2 having a control electrode connected with the Q-node QN, an input electrode connected with the first clock terminal CK1, and an output electrode connected with the carry terminal CR. The carry transistor NT2 pulls up the present gate signal, which is output through the carry terminal CR, to the high level of the first clock CKV in response to the voltage output from the pull-down unit 213. The carry transistor NT2 is turned on during the first interval of one frame to maintain the present carry signal in a high state during the first interval.

The pull-down unit 213 includes a pull-down transistor NT3 having a control electrode connected with the control terminal CT, an input electrode connected with the voltage input terminal Vin, and an output electrode connected with the output terminal OUT. The pull-down transistor NT3 pulls down the pulled-up present gate signal to the gate off voltage $V_{off}$ (see FIG. 1), which is supplied through the voltage input terminal Vin, in response to the next gate signal. In detail, the pull-down transistor NT3 is turned on by the next gate signal after the first interval to allow the present gate signal to be in a low state.

The pull-up driver 214 includes a buffer transistor NT4, a first capacitor C1, a second capacitor C2 and a discharge transistor NT5. The buffer transistor NT4 includes an input electrode and a control electrode that are commonly connected with the input terminal IN, and an output electrode connected with the Q-node QN. The first capacitor C1 is connected between the Q-node QN and the output terminal OUT, and the second capacitor C2 is connected between the control electrode of the carry transistor NT2 and the carry terminal CR. The discharge transistor NT5 includes an input electrode connected with the output electrode of the buffer transistor NT4, a control electrode connected with the control terminal CT, and an output electrode connected with the voltage input terminal Vin.

If the buffer transistor NT4 is turned on in response to the previous carry signal, an electric potential of the Q-node QN increases, so that the pull-up transistor NT1 and the carry transistor NT2 are turned on. Then, if electric potentials of the output terminal OUT and the carry terminal CR increase by the pull-up transistor NT1 and the carry transistor NT2 which are turned on, the potential of the Q-node QN is boosted up by the first and second capacitors C1 and C2. Thus, the pull-up transistor NT1 and the carry transistor NT2 are continuously turned on, so that the present gate and carry signals may be generated in a high state during the high interval of the first clock CKV.

If the discharge transistor NT5 is turned on in response to the next gate signal, electric charges in the first capacitor C1 are discharged to the gate off voltage $V_{off}$ through the discharge transistor NT5. Thus, the electric potential of the Q-node QN is lowered to the gate off voltage $V_{off}$, so that the pull-up transistor NT1 and the carry transistor NT2 are turned off. As a result, the present gate signal and the carry signal in the high state are not output through the output terminal OUT and the carry terminal CR.

The ripple preventing unit 215 includes first to third ripple preventing transistors NT6 to NT8 to prevent the present gate signal and the carry signal from being rippled by the first clock CKV or the second clock CKVB during a second interval except for the first interval of one frame.

The first ripple preventing transistor NT6 includes a control electrode connected with the first clock terminal CK1, an input electrode connected with the output terminal OUT, and an output electrode connected with the Q-node QN. The second ripple preventing transistor NT7 includes a control electrode connected with the second clock terminal CK2, an input electrode connected with the input terminal IN, and an output electrode connected with the Q-node QN. The third ripple preventing transistor NT8 includes a control electrode connected with the second clock terminal CK2, an input electrode connected with the output terminal OUT, and an output electrode connected with the voltage input terminal Vin.

During the second interval, the first ripple preventing transistor NT6 provides the Q-node QN with the present gate signal in a low state, which is output from the output terminal OUT, in response to the first clock CKV. Thus, the electric potential of the Q-node QN is maintained in a low state in the high interval of the first clock CKV in the second interval, so that the first ripple preventing transistor NT6 prevents the pull-up transistor NT1 and the carry transistor NT2 from being turned on during the high interval of the first clock CKV in the second interval.

During the second interval, the second ripple preventing transistor NT7 provides the Q-node QN with the previous carry signal in a low state, which is input through the input terminal IN, in response to a clock (hereinafter, referred to as the second clock CKVB as shown in FIG. 1) provided through the second clock terminal CK2. Thus, the electric potential of the Q-node QN is maintained in a low state in the high interval of the second clock CKVB in the second interval, so that the second ripple preventing transistor NT7 prevents the pull-up transistor NT1 and the carry transistor NT2 from being turned on during the high interval of the second clock CKVB in the second interval.

The present gate signal is discharged to the gate off voltage $V_{off}$ by the third ripple preventing transistor NT8 when the second clock CKVB is supplied to the third ripple preventing transistor NT8. Thus, the present gate signal is maintained at the gate off voltage $V_{off}$ during the high interval of the second clock CKVB in the second interval.

The holding unit 216 includes a holding transistor NT9 having a control electrode connected with an output terminal of the inverter unit 217, an input electrode connected with the voltage input terminal Vin, and an output electrode connected with the output terminal OUT. The inverter unit 217 includes first, second, third and fourth inverter transistors NT10, NT11, NT12 and NT13, and third and fourth capacitors C3 and C4 to turn on or off the holding transistor NT9.

The first inverter transistor NT10 includes input and control electrodes commonly connected with the first clock terminal CK1, and an output electrode connected with an output electrode of the second inverter transistor NT11 through the fourth capacitor C4. The second inverter transistor NT11 includes an input electrode connected with the first clock terminal CK1, a control electrode connected with the input electrode through the third capacitor C3, and an output electrode connected with the output electrode of the holding transistor NT9. The third inverter transistor NT12 includes an input electrode connected with the output electrode of the first inverter transistor NT10, a control electrode connected with the output terminal OUT, and an output electrode connected with the voltage input terminal Vin. The fourth inverter transistor NT13 includes an input electrode connected with the control electrode of the holding transistor NT9, a control electrode connected with the output terminal OUT, and an output electrode connected with the voltage input terminal Vin.

If the third and fourth inverter transistors NT12 and NT13 are turned on in response to the present gate signal in a high state output through the output terminal OUT, the first clocks CKV output from the first and second inverter transistors NT10 and NT11 are discharged to the gate off voltage $V_{off}$ by the third and fourth inverter transistors NT12 and NT13. Thus, the holding transistor NT9 is turned off during the first interval in which the present gate signal is maintained in the high state.

Then, if the present gate signal is transited to a low state in the second interval, the third and fourth inverter transistors NT12 and NT13 are turned off. Thus, the first clock CKV output from the first and second inverter transistors NT10 and NT11 are applied to the holding transistor NT9 to turn on the holding transistor NT9. As a result, the present gate signal may be maintained in the gate off voltage $V_{off}$ by the holding transistor NT9 during the high interval of the first clock CKV in the second interval.

Meanwhile, the reset unit 218 includes a reset transistor NT14 having a control electrode connected with the reset terminal RE, an input electrode connected with the control electrode of the pull-up transistor NT1, and an output electrode connected with the voltage input terminal Vin.

The electric potential of the Q-node is discharged to the gate off voltage $V_{off}$ by the reset transistor NT14 when a signal is supplied to the reset transistor NT14 from the output terminal OUT of the dummy stage DSRC (see FIG. 2) through the reset terminal RE. Thus, the pull-up transistor NT1 and the carry transistor NT2 are turned off in response to the reset signal of the dummy stage DSRC. As illustrated in FIG. 2, the output signal of the dummy stage DSRC is provided to the reset terminals RE of the n driving stages SRC1 to SRCn to turn off the pull-up transistor NT1 and the carry transistor NT1 and NT2 provided in each driving stage, so that the n driving stages SRC1 to SRCn may be reset.

The transistors provided in the stages of the gate driver 210 include amorphous silicon ("a-Si") transistors.

As illustrated in FIG. 1, after the gate driver 210 having the structure as described above is formed on the LCD panel 100, the gate driver 210 is subject to an aging process (severe environment test) to change threshold voltage of the transistors provided in the stages.

Figure 5:
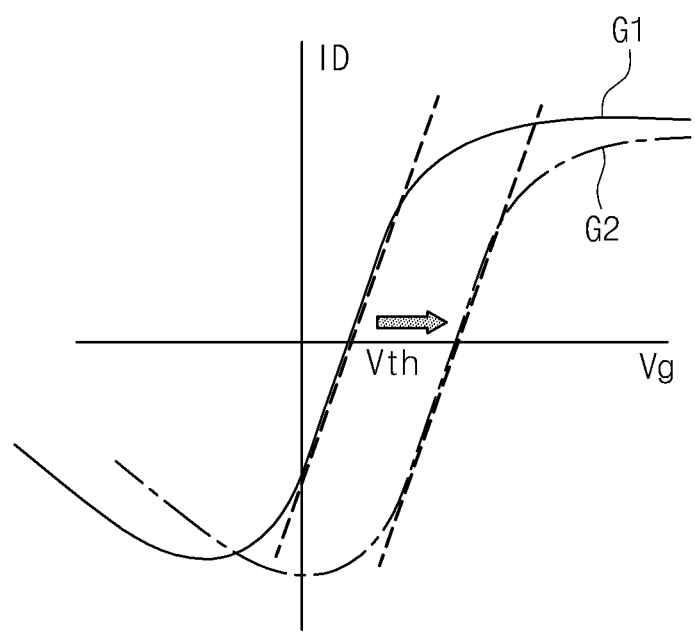
FIG. 5 is a graph illustrating variation of a threshold voltage due to high temperature aging.

FIG. 5 is a graph illustrating variation of the threshold voltage according to the aging process. In FIG. 5, an X-axis denotes a gate voltage Vg of a transistor and a Y-axis denotes a drain current ID of the transistor. Further, a first graph G1 denotes a threshold voltage Vth of the transistor before the aging process is performed and a second graph G2 denotes the threshold voltage Vth of the transistor after the aging process is performed.

Referring to FIG. 5, since the aging process is performed at the high temperature, the threshold voltage Vth of the transistor increases due to the temperature after the aging process is performed. The threshold voltage Vth of the transistor provided in each stage increases, thereby causing malfunction of each stage. As a result, an abnormal waveform may be output from the stages.

As the delay time of the first and second clocks CKV and CKVB supplied to the stages is reduced, a margin of the threshold voltage Vth increases, so that the stages may not malfunction. Accordingly, in the exemplary embodiments of the present invention, the delay time of the first and second clocks CKV and CKVB is reduced to be less than about 2.0 µs, so that the margin of the threshold voltage Vth can be increased more than 20V. Thus, the gate driver 210 may be prevented from malfunctioning in the high temperature aging process.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A display apparatus comprising:
a display panel having gate lines which sequentially receive a gate signal, data lines which receive a data signal, and a plurality of pixels which display an image corresponding to the data signal in response to the gate signal;
a data driver which provides the data signal to the data lines; and
a gate driver provided in the display panel and which receives at least one clock via a clock interconnection to sequentially provide the gate lines with the gate signal in a high state corresponding to a high interval of the clock,
wherein the clock interconnection with the gate driver is configured to provide the clock having a delay time of about 2.0 μs or less,
wherein the gate driver comprises:
a shift register having a plurality of stages connected with each other one after another to sequentially output the gate signal;
a first clock interconnection of the clock interconnection to provide the stages with a first clock;
a second clock interconnection of the clock interconnection to provide the stages with a second clock different from the first clock; and
a plurality of amorphous silicon transistor,
wherein each of the first and second clock interconnections has a thickness of a bout 1500 Å to about 3000 Å,
wherein the transistors have a threshold voltage margin increase of at least 20V in an aging process when the clock interconnection with the gate driver is configured to provide the clock having a delay time of about 2.0 μs or less.

2. The display apparatus of claim 1, wherein the first clock has an opposite phase to a phase of the second clock, and each of the first and second clocks have a delay time of about 2.0 μs or less.

3. The display apparatus of claim 1, wherein each of the first and second clock interconnections has a structure, in which at least one layer is laminated.

4. The display apparatus of claim 3, wherein each of the first and second clock interconnections comprises:
a first interconnection layer containing a gate metal; and
a second interconnection layer containing a data metal.

5. The display apparatus of claim 4, further comprising an insulating layer interposed between the first and second clock interconnections, wherein the insulating layer is formed with at least one contact hole formed therethrough to expose the first interconnection layer, and the second interconnection layer is electrically connected with the first interconnection layer through the contact hole.

6. The display apparatus of claim 4, wherein the first interconnection layer and the gate lines are formed in a same layer of the display panel, and the second interconnection layer and the data lines are formed in a same layer of the display panel.

7. The display apparatus of claim 1, wherein the data driver comprises at least one chip.

8. A method of preventing a gate driver in a display apparatus from malfunctioning due to a high temperature aging process, the display apparatus including a display panel having gate lines to sequentially receive a gate signal, data lines to receive a data signal from a data driver, and a plurality of pixels to display an image corresponding to the data signal in response to the gate signal, the method comprising:
forming a gate driver in the display panel to receive at least one clock via a clock interconnection to sequentially provide the gate lines with the gate signal in a high state corresponding to a high interval of the clock; and,
delivering the clock within the gate driver with a delay time of about 2.0 μs or less based on a configuration of the clock interconnection,
wherein forming the gate driver includes:
forming a shift register having a plurality of stages connected with each other one after another to sequentially output the gate signal;
forming a first clock interconnection providing the stages with a first clock;
forming a second clock interconnection of the clock interconnection providing the stages with a second clock different from the first clock; and
forming a plurality of amorphous silicon transistors,
wherein forming the first and second clock interconnections includes forming each of the first and second clock interconnections with a thickness of about 1500 Å to about 3000 Å,
wherein, during the high temperature ageing process, a threshold voltage margin of transistors in the gate driver is increased by more than about 20V when the clock interconnection with the gate driver is configured to provide the clock having a delay time of about 2.0 μs or less.

9. The method of claim 8, wherein forming the first clock interconnection includes forming a first interconnection layer in a same layer of the display panel as the gate lines and forming the second clock interconnection includes forming a second interconnection layer in a same layer of the display panel as the data lines.

10. The method of claim 9, further comprising forming an insulating layer between the first and second interconnection layers, forming the insulating layer with at least one contact hole therethrough to expose the first interconnection layer, and electrically connecting the second interconnection layer with the first interconnection layer through the contact hole.

11. The method of claim 8, further comprising increasing a thickness of the first and second clock interconnections to reduce the delay time of the first and second clocks to about 2.0 μs or less.

12. The method of claim 8, further comprising increasing a width of the first and second clock interconnections to reduce the delay time of the first and second clocks to about 2.0 μs or less.

13. The display apparatus of claim 4, wherein the first interconnection layer and the second interconnection layer are a single layer.

14. The display apparatus of claim 13, wherein the first interconnection layer and the second interconnection layer is provided in the same layer as the gate lines.

* * * * *